(12) United States Patent
Wang et al.

(10) Patent No.: US 9,083,385 B2
(45) Date of Patent: Jul. 14, 2015

(54) CHANNEL DECODING METHOD AND DECODER FOR TAIL-BITING CODES

(75) Inventors: Xiaotao Wang, Shanghai (CN); Hua Qian, Shanghai (CN); Jing Xu, Shanghai (CN); Hao Huang, Shanghai (CN); Yang Yang, Shanghai (CN); Fang Wang, Shanghai (CN)

(73) Assignee: SHANGHAI RESEARCH CENTER FOR WIRELESS COMMUNICATIONS, Shanghai (CN)

( * ) Notice: Subject to any disclaimer, the term of this patent is extended or adjusted under 35 U.S.C. 154(b) by 8 days.

(21) Appl. No.: 13/809,932

(22) PCT Filed: Mar. 19, 2012

(86) PCT No.: PCT/CN2012/072522
§ 371 (c)(1),
(2), (4) Date: Jan. 14, 2013

(87) PCT Pub. No.: WO2012/163135
PCT Pub. Date: Dec. 6, 2012

(65) Prior Publication Data
US 2013/0111305 A1      May 2, 2013

(30) Foreign Application Priority Data

May 27, 2011  (CN) .......................... 2011 1 0141150
Jul. 19, 2011  (CN) .......................... 2011 1 0202238

(51) Int. Cl.
*H03M 13/03*  (2006.01)
*H03M 13/23*  (2006.01)
(Continued)

(52) U.S. Cl.
CPC .......... *H03M 13/23* (2013.01); *H03M 13/3738* (2013.01); *H03M 13/413* (2013.01); *H03M 13/6505* (2013.01); *H03M 13/1505* (2013.01); *H03M 13/6525* (2013.01)

(58) Field of Classification Search
CPC . H03M 13/23; H03M 13/2957; H04L 1/0059
USPC ................................. 714/752, 755, 794–796
See application file for complete search history.

(56) References Cited

U.S. PATENT DOCUMENTS 5,369,671 A * 11/1994 Yehushua et al. .............. 375/341
7,010,052 B2 * 3/2006 Dill et al. ....................... 375/265
(Continued)

FOREIGN PATENT DOCUMENTS

CN        1841546 A     10/2006
CN      101047472 A     10/2007
(Continued)

OTHER PUBLICATIONS

International Search Report issued in International Patent Application No. PCT/CN2012/072522 dated May 30, 2012.

*Primary Examiner* — Esaw Abraham
(74) *Attorney, Agent, or Firm* — Oliff PLC

(57) ABSTRACT

A channel decoding method and decoder are disclosed. The decoding method is based on a Circular Viterbi Algorithm (CVA), rules out impossible initial states one by one through iterations according the received soft information sequence, and finally finds the global optimal tail-biting path. In the present invention, all impossible iterations are ruled out through multiple iterations, and only the initial state having most likelihood with the received sequence survives. The algorithm is finally convergent to an optimal tail-biting path to be output. In addition, the method also updates a metric of a maximum likelihood tail-biting path (MLTBP) or rules out impossible initial states through the obtained surviving tail-biting path, thereby effectively solving the problem that the algorithm is not convergent due to a circular trap, providing a practical optimal decoding algorithm for a tail-biting convolutional code, reducing the complexity of an existing decoding scheme, and saving the storage space.

5 Claims, 6 Drawing Sheets

(51) Int. Cl.
*H03M 13/37* (2006.01)
*H03M 13/41* (2006.01)
*H03M 13/00* (2006.01)
H03M 13/15 (2006.01)

(56) References Cited

U.S. PATENT DOCUMENTS

| | | |
|---|---|---|
| 7,603,611 B2 | 10/2009 | Shiraishi |
| 7,856,591 B2 | 12/2010 | Shi et al. |
| 7,861,137 B2 * | 12/2010 | Lou et al. ...................... 714/762 |
| 8,136,023 B2 | 3/2012 | Shi et al. |
| 8,219,896 B2 * | 7/2012 | Chen et al. .................... 714/795 |
| 8,230,308 B2 * | 7/2012 | Takanashi ..................... 714/792 |
| 8,312,358 B2 * | 11/2012 | Zeng et al. .................... 714/795 |
| 8,489,972 B2 * | 7/2013 | Wong et al. ................... 714/795 |
| 8,707,145 B2 * | 4/2014 | Weisman et al. .............. 714/792 |
| 2010/0095189 A1 | 4/2010 | Park et al. |
| 2011/0060971 A1 | 3/2011 | Zeng et al. |

FOREIGN PATENT DOCUMENTS

| | | |
|---|---|---|
| CN | 101635611 A | 1/2010 |
| CN | 101667840 A | 3/2010 |

\* cited by examiner

US 9,083,385 B2

CHANNEL DECODING METHOD AND DECODER FOR TAIL-BITING CODES

BACKGROUND OF THE PRESENT INVENTION

1. Field of Invention

The present invention belongs to the field of information technologies, and relates to a decoding method, and specifically to a channel decoding method and decoder for tail-biting codes.

2. Description of Related Arts

In existing and next generation mobile communications networks, in order to ensure reliable transmission of data and control signaling, tail-biting convolutional codes, as highly efficient encoding scheme, are widely applied in various mobile communications systems. The tail-biting convolutional code is used in early IS-54, and current Enhanced Data Rate for GSM Evolution (EDGE), Worldwide Interoperability for Microwave Access (WiMax) and Long Term Evolution (LTE) systems. The tail-biting convolutional code is widely applied because the convolutional code encoded in a tail-biting manner eliminates the code rate loss caused by the known tail-bits that are used to initialize the encoder; meanwhile, a tail-biting structure provides all information bits with the same protection capability. Due to the above advantages, the tail-biting convolutional code is widely applied in various communications systems and serves as an encoding manner for control signaling. For short information sequence, encoding in tail-biting manner provides significant protection on code rate. For example, if an information sequence with cyclic redundancy check bits of total length of 40 bits in LTE broadcast channel is not encoded in tail-biting manner, the code rate loss reaches 13%. Currently, tail-biting convolutional codes have been used in EDGE, WiMax, LTE, and so on for control channel encoding.

Although the tail-biting convolutional code has a lot of advantages, implementation of an optimal decoding scheme based on the Viterbi algorithm is complex because a decoder knows neither the initial state nor the termination state of the encoder. Therefore, no optimal decoding scheme based on the Viterbi algorithm is available currently. A large quantity of current decoding algorithms, such as the Wrap-Around Viterbi Algorithm (WAVA) based on the circular Viterbi algorithm, are sub-optimal decoding algorithms. In order to find an optimal decoding algorithm for tail-biting convolutional codes, some scholars apply the shortest path search algorithm in the graph theory to the decoding algorithm of tail-biting convolutional codes, and obtain a two-step maximum likelihood decoding algorithm through designing a proper heuristic function. In the first step of the algorithm, the accumulated metrics of all surviving paths at each moment are obtained through a Modified Viterbi Algorithm (MVA). In the second step of the algorithm, an optimal tail-biting path output is obtained through a shortest path search algorithm. Such decoders use completely different search methods in the two steps, which is excessively complex for practical applications. Moreover, despite the partial reduction of the calculation amount, the heuristic search used in the algorithm requires a great number of push and pull operations as well as sequencing operations, and most importantly, the utilization ratio of a storage space is decreased. The space application is performed on the basis of the maximum storage space, leading to a low utilization ratio of a lot of storage spaces. Although search branches of such algorithm in Step 2 is significantly reduced as compared with the WAVA, the entire algorithm is performed in series since the search for a path corresponding to the minimum value of the current function f is performed under the instruction of the heuristic function, and an actual performing period is longer than that of two circles of the Viterbi algorithm.

SUMMARY OF THE PRESENT INVENTION

An objective of the present invention is to provide a channel decoding method and decoder, in which the decoding method is capable of implementing reduced-complexity optimal decoding of a tail-biting convolutional code.

In order to solve the above technical problems, the present invention uses the following technical solutions.

A channel decoding method is provided, which comprises the following steps:

S101: during the first iteration, i.e. i=1, initializing the metric $M_{path,0}^{i}(s)$ of the surviving path that enters state s at position 0 to 0, where $s \in S_0$, $S_0$ indicates the state space at position 0, and i indicates the number of iterations; setting the metric of the optimal maximum likelihood tail-biting path (MLTBP) $P_{MLTBP}^{O}$ to 0, that is, letting $M_{MLTBP}^{O}=0$; performing an MVA, and searching for MLTBP in current iteration; for all $s \in S_0$, setting the state metric of state s to be equal to $M_{path,L}^{1}(s)$, that is, letting $M_{state}(s)=M_{path,L}^{1}(s)$;

S102: if the net path metric $M_{MLTBP}^{i}$ of $P_{MLTBP}^{i}(s',s')$ found in current iteration is greater than the metric $M_{MLTBP}^{O}$, that is, $M_{MLTBP}^{i}>M_{MLTBP}^{O}$, updating $(P_{MLTBP}^{O}, M_{MLTBP}^{O})$ with $(P_{MLTBP}^{i}(s',s'), M_{MLTBP}^{i})$;

S103: for $s \in S_L$, where L is the length of information sequence, and $S_L$ indicates the state space at position L, comparing the state metric $M_{state}(s)$ of state s with the metric $M_{MLTBP}^{O}$ of the MLTBP in the latest update; if $M_{state}(s) \leq M_{MLTBP}^{O}$, updating $M_{state}(s)=0$; otherwise, letting $M_{path,0}^{i+1}(s)=M_{path,L}^{i}(s)$; if $M_{state}(s)>M_{path,L}^{i}(s)-M_{path,0}^{i}(s)$, updating $M_{state}(s)=M_{path,L}^{i}(s)-M_{path,0}^{i}(s)$; making statistics on the number of states with state metric greater than $M_{MLTBP}^{O}$, and saving the number of states in sum(i);

S104: if sum(i)=0, stopping the iteration, and outputting the optimal MLTBP $P_{MLTBP}^{O}$; if sum(i)=sum(i−1), performing Viterbi decoding once with state β(s) as fixed initial state and termination state, where β(s) is the starting state of the maximum likelihood path (MLP) found in the ith iteration, i.e. $P_{MLP}^{i}(\beta(s),s)$; obtaining a tail-biting path $P_{TBP}(\beta(s),\beta(s))$ with metric $M_{TBP}(\beta(s),\beta(s))$ thereof; if $M_{TBP}(\beta(s),\beta(s))>M_{MLTBP}^{O}$, updating $(P_{MLTBP}^{O}, M_{MLTBP}^{O})$ with $(P_{TBP}(\beta(s),\beta(s)), M_{TBP}(\beta(S),\beta(s)))$, and letting $M_{state}(\beta(s))=0$ and $M_{path,0}^{i+1}(\beta(s))=0$.

S105: i++ and letting sum(i)=0, and performing a next iteration, that is, repeating S102 to S104.

A channel decoding method is provided, which comprises the following steps:

S201: setting the maximum allowed number of iterations N=20 when i=1 (during the first iteration), initializing an accumulated metric of each initial state to 0, that is, $M_{path,0}^{i}(s)=0$, where $s \in S_0$, and performing an MVA.

S202: if the maximum likelihood path (MLP) is equal to the optimal tail-biting path, that is, $P_{MLP}^{1}=P_{MLTBP}^{1}$, stopping decoding, and outputting $P_{MLTBP}^{1}$ as the decoding result; otherwise, saving $P_{MLP}^{1}$ in $P_{MLP}^{O}$; if $M_{MLTBP}^{1}>0$, letting $P_{MLTBP}^{O}=P_{MLTBP}^{1}$ and $M_{MLTBP}^{O}=M_{MLTBP}^{1}$;

S203: when i>1 (in an iteration after the first iteration), letting $M_{path,0}^{i}(s)=M_{path,L}^{i-1}(s)$, and performing an MVA; finding $(P_{MLP}^{i}, M_{MLP}^{i})$; finding $(P_{MLTBP}^{i}, M_{MLTBP}^{i})$, and if $M_{MLTBP}^{i}>M_{MLTBP}^{O}$, letting $P_{MLTBP}^{O}=P_{MLTBP}^{i}$;

S204: if either $M_{MLP}^{i}=M_{MLTBP}^{i}$ or $M_{MLTBP}^{i}=M_{MLTBP}^{O}$ is satisfied, stopping decoding, and performing S206; otherwise, continuing to perform S205;

S205: if $M_{MLTBP}^i > M_{MLTBP}^O$, letting $M_{MLTBP}^O = M_{MLTBP}^i$; if N is not reached, i.e. i<N, returning to S203; otherwise, performing S206;

S206: if $P_{MLTBP}^O$ exists, outputting $P_{MLTBP}^O$ as the decoding result; otherwise, outputting $P_{MLP}^O$.

A channel decoding method is provided, which comprises the following steps:

S301: setting the maximum allowed number of iterations N=20 when i=1 (during the first iteration), initializing an accumulated metric entering each initial state to 0, that is, $M_{path,0}^i(s)=0$, where $s \in S_0$, and performing an MVA;

S302: if the maximum likelihood path (MLP) is equal to the optimal tail-biting path, that is, $P_{MLP}^1 = P_{MLTBP}^1$, stopping decoding, and outputting $P_{MLTBP}^1$ as the decoding result; otherwise, saving $P_{MLP}^1$ in $P_{MLP}^O$; if $M_{MLTBP}^1 > 0$, letting $P_{MLTBP}^O = P_{MLTBP}^1$ and $M_{MLTBP}^O = M_{MLTBP}^1$;

S303: when i>1 (in an iteration after the first iteration), letting $M_{path,0}^i(s) = M_{path,L}^{i-1}(s)$, and performing an MVA; finding $(P_{MLP}^i, M_{MLP}^i)$; finding $(P_{MLTBP}^i, M_{MLTBP}^i)$, and if $M_{MLTBP}^i > M_{MLTBP}^O$, letting $P_{MLTBP}^O = P_{MLTBP}^i$;

S304: if either $M_{MLP}^i = M_{MLTBP}^i$ or $M_{MLP}^i = M_{MLP}^{i-1}$ is satisfied, stopping decoding, and performing S306; otherwise, continuing to perform S305;

S305: if $M_{MLTBP}^i > M_{MLTBP}^O$, letting $M_{MLTBP}^O = M_{MLTBP}^i$; if N is not reached, i.e. i<N, returning to S303; otherwise, performing S306;

S306: if $P_{MLTBP}^O$ exists, outputting $P_{MLTBP}^O$ as the decoding result; otherwise, outputting $P_{MLP}^O$.

A channel decoder is provided, which comprises the following modules:

an initialization module, used for initializing an accumulated path metric of each initial state to 0, that is, $M_{path,0}^i(s)=0$, where $s \in S_0$, and performing an MVA during the first iteration (when i=1); setting the maximum allowed number of iterations N=20.

a determination module, used for determining whether an MLP is equal to an optimal tail-biting path, that is, whether $P_{MLP}^1 = P_{MLTBP}^1$; if yes, stopping decoding and outputting $P_{MLTBP}^1$ as a decoding result; otherwise, saving $P_{MLP}^1$, and making an optimal MLP equal to the MLP, that is, $P_{MLP}^O = P_{MLP}^1$; if $M_{MLTBP}^1 > 0$, letting $P_{MLTBP}^O = P_{MLTBP}^1$ and $M_{MLTBP}^O = M_{MLTBP}^1$;

an iteration module, used for performing an iteration operation, specifically, when i>1 (in an iteration after the first iteration), initializing the accumulated path metric of the surviving path that enters state s in ith iteration to be the accumulated path metric $M_{path,L}^{i-1}(s)$ of the path terminated at state s at the end of the previous iteration, that is, letting $M_{path,0}^i(s) = M_{path,L}^{i-1}(s)$, and performing an MVA; finding $(P_{MLP}^i, M_{MLP}^i)$; finding $(P_{MLTBP}^i, M_{MLTBP}^i)$, and if $M_{MLTBP}^i > M_{MLTBP}^O$, letting $P_{MLTBP}^O = P_{MLTBP}^i$;

an iteration determination module, used for stopping decoding according to a preset condition (if either $M_{MLP}^i = M_{MLTBP}^i$ or $M_{MLTBP}^i = M_{MLTBP}^O$ is satisfied), and enabling result output of a result output module when $P_{MLTBP}^O$ exists; if $M_{MLTBP}^i > M_{MLTBP}^O$, letting $M_{MLTBP}^O = M_{MLTBP}^i$; and if the maximum allowed number of iterations is not reached, continuing the operation of the iteration module; and the result output module, used for outputting a decoding result, that is, when $P_{MLTBP}^O$ exists, outputting $P_{MLTBP}^O$ as a decoding result; otherwise, outputting $P_{MLP}^O$.

A channel decoder is provided, which comprises the following modules:

an initialization module, used for initializing an accumulated path metric of each initial state to 0, that is, $M_{path,0}^i(s)=0$, where $s \in S_0$, and performing an MVA during the first iteration (when i=1); setting the maximum allowed number of iterations N=20;

a determination module, used for determining whether an MLP is equal to an optimal tail-biting path, that is, whether $P_{MLP}^1 = P_{MLTBP}^1$; if yes, stopping decoding and outputting $P_{MLTBP}^1$ as a decoding result; otherwise, saving $P_{MLP}^1$, and making an optimal MLP equal to the MLP, that is, $P_{MLP}^O = P_{MLP}^1$ if $M_{MLTBP}^1 > 0$, letting $P_{MLTBP}^O = P_{MLTBP}^1$ and $M_{MLTBP}^O = M_{MLTBP}^1$;

an iteration module, used for performing an iteration operation, specifically, when i>1 (in an iteration after the first iteration), initializing the accumulated path metric of the surviving path that enters state s in ith iteration to be the accumulated path metric $M_{path,L}^{i-1}(s)$ of the path terminated at state s at the end of the previous iteration, that is, letting $M_{path,0}^i(s) = M_{path,L}^{i-1}(s)$, and performing an MVA; finding $(P_{MLP}^i, M_{MLP}^i)$; finding $(P_{MLTBP}^i, M_{MLTBP}^i)$, and if $M_{MLTBP}^i > M_{MLTBP}^O$, letting $P_{MLTBP}^O = P_{MLTBP}^i$;

an iteration determination module, used for stopping decoding according to a preset condition (if either $M_{MLP}^i = M_{MLTBP}^i$ or $M_{MLP}^i = M_{MLP}^{i-1}$ is satisfied), and enabling result output of a result output module when $P_{MLTBP}^O$ exists; if $M_{MLTBP}^i > M_{MLTBP}^O$, letting $M_{MLTBP}^O = M_{MLTBP}^i$; and if the maximum allowed number of iterations is not reached, continuing the operation of the iteration module; and the result output module, used for outputting a decoding result, that is, when $P_{MLTBP}^O$ exists, outputting $P_{MLTBP}^O$ as a decoding result; otherwise, outputting $P_{MLP}^O$.

The present invention has the following beneficial effects: the channel decoding method provided in the present invention rules out all impossible states through multiple iterations, and only the initial state of the MLTBP survives, and finally the algorithm is convergent to global optimal tail-biting path. In addition, the method also updates the metric of the best tail-biting path found in the first i iterations, and rules out β(s) from the set of the initial states candidates, thereby effectively solving the problem that the algorithm is not convergent due to a circular trap, and providing a practical optimal decoding algorithm for the tail-biting convolutional code, reducing the complexity of an existing decoding scheme, reducing the number of iterations, and saving the storage space during decoding.

DETAILED DESCRIPTION OF THE PREFERRED EMBODIMENTS

In view of the problems of the algorithms in the prior art, the present invention provides a practical optimal decoding algorithm based on a Circular Viterbi Algorithm (CVA), namely, a method for decoding tail-biting convolutional codes. The decoding method implements reduced-complexity optimal decoding for the tail-biting convolutional codes. Meanwhile, the method of the present invention also implements reduced-complexity optimal decoding for block codes that can be represented by a tail-biting trellis diagram.

The channel decoding method according to the present invention applies to decoding a tail-biting convolutional code in current wireless communications systems (such as EDGE) as well as next-generation mobile communications systems (such as WiMax and LTE), and is also effective for block codes (such as a (24, 12) Golay code) that can be represented by a tail-biting trellis diagram.

The channel decoding method according to the present invention is a reduced-complexity and practical optimal decoding scheme for a tail-biting convolutional code, namely, a maximum likelihood decoding algorithm. The present invention is based on the CVA, and rules out impossible initial states one by one through iterations according to a received soft information sequence, and finally finds the global optimal tail-biting path. The decoding method according to the present invention accelerates the convergence speed of a decoder through effectively processing a circular trap. Meanwhile, the algorithm is simple and easy to implement, and has a critical application value.

Embodiments of the present invention are further described in detail below with reference to the accompanying drawings.

Embodiment 1

For a tail-biting convolutional code, the initial state of the encoder is initialized with last few information bits, and when the encoding is ended, the encoder is terminated at the same state as the initial state thereof, which is referred to as "tail-biting".

This embodiment provides a channel decoding method, which searches for the optimal tail-biting path through performing CVA. During the circulation, it may happen that all surviving paths in two circulations are completely the same, and this situation is referred to as a circular trap. The channel decoding method detects the circular trap, and effectively processes the circular trap to accelerate a convergence speed of the algorithm.

Figure 1:
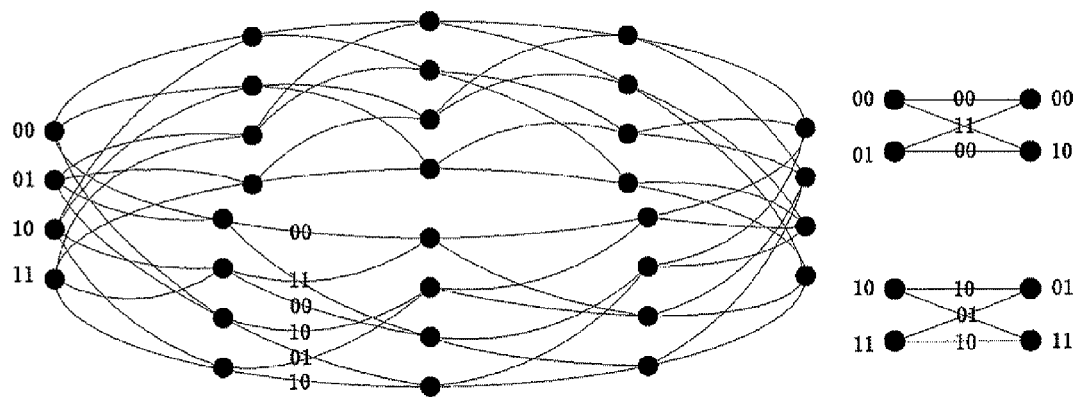
FIG. 1 is a tail-biting trellis diagram.

The trellis diagram in FIG. 1 is obtained by a convolutional encoder with generator polynomials of $\{7, 5\}$ (in octal). Each position k has four states, and the total length L of the trellis diagram is equal to 8, namely, $0 \leq k \leq 7$. A state space $S_k$ at each position k is expressed as follows: $S_k=\{00, 01, 10, 11\}$.

It is assumed that each position k in the trellis diagram has $2^v$ states, where $0 \leq k \leq L-1$, v is the number of encoding registers, L is a length of the information sequence, $S_k$ indicates a state space at position k, and the position where k=L is the position where k=0.

It is assumed that in the ith iteration, $M_{path,k}^i(s)$ indicates the accumulated path metric of the surviving path that enters state s at position k. $P^i(\beta(s),s)$ indicates the surviving path starting from state $\beta(s)$ and terminated at state s, where $s \in S_L$, $\beta(s) \in S_0$. In the ith iteration, the net path metric of the surviving path $P^i(\beta(s),s)$ is recorded as $M_{path}^i(\beta(s),s)$, which indicates a sum of metrics of all branches of the path in the current iteration, that is, $M_{path}^i(\beta(s),s)=M_{path,L}^i(s)-M_{path,0}^i(\beta(s))$. It is assumed that the MLP obtained in the ith iteration is $P_{MLP}^i(\beta(s),s)$, and the obtained MLTBP and net path metric are respectively $P_{MLTBP}^i(s',s')$ and $M_{MLTBP}^i(s',s')$.

Similarly, the state metric of state s is defined as follows: $M_{state}(s)=M_{path,L}^i(s)-M_{path,0}^i(s) \cdot (P_{MLTBP}^O, M_{MLTBP}^O)$ is used to record the optimal MLTBP found till the current iteration and a metric thereof. After the ith iteration, some of the survivor paths with net path metric greater than $M_{MLTBP}^O$, and others with the net path metric less than $M_{MLTBP}^O$. A variable sum(i) is used to record the number of surviving paths with net path metric greater than $M_{MLTBP}^O$ when the current iteration is ended.

A process of the channel decoding method specifically comprises the following steps:

Step 101:

When i=1 (during the first iteration), initialize a metric $M_{path,0}^i(s)$ of all surviving paths that enters state s at position 0 to 0, that is, $M_{path,0}^i(s)=0$, where $s \in S_0$, $S_0$ indicates a state space at position 0, and i indicates the number of iterations; setting the metric of the optimal maximum likelihood tail-biting path (MLTBP) $P_{MLTBP}^O$ to 0, that is, letting $M_{MLTBP}^O=0$; performing an MVA, and searching for MLTBP in current iteration $P_{MLTBP}^i(s',s')$; for all $s \in S_0$, setting the state metric of state s to be equal to $M_{path,L}^1(s)$, that is, letting $M_{state}(s)=M_{path,L}^1(s)$; $M_{path,L}^1(s)$ indicates a metric of surviving path that enters state s at position L during the first iteration.

Step 102:

Find the MLP $P_{MLP}^i(\beta(s),s)$ and the MLTBP $P_{MLTBP}^i(s',s')$, if the net path metric $M_{MLTBP}^i$ of $P_{MLTBP}^i(s',s')$ found in current iteration is greater than the metric $M_{MLTBP}^O$, that is, $M_{MLTBP}^i > M_{MLTBP}^O$, updating $(P_{MLTBP}^O, M_{MLTBP}^O)$ with $(P_{MLTBP}^i(s',s'), M_{MLTBP}^i)$;

Step 103:

For $s \in S_L$, where L is the length of information sequence, and $S_L$ indicates the state space at position L, comparing the state metric $M_{state}(s)$ of state s with the metric $M_{MLTBP}^O$ of the MLTBP in the latest update; if $M_{state}(s) \leq M_{MLTBP}^O$, updating $M_{state}(s)=0$; otherwise, letting $M_{path,0}^{i+1}(s)=M_{path,L}^i(s)$; if $M_{state}(s) > M_{path,L}^i(s) - M_{path,0}^i(s)$, updating $M_{state}(s) = M_{path,L}^i(s) - M_{path,0}^i(s)$; making statistics on the number of states with state metric greater than $M_{MLTBP}^O$, and saving the number of states in sum(i);

Step 104:

If sum(i)=0, stopping the iteration, and outputting the optimal MLTBP $P_{MLTBP}^O$; if sum(i)=sum(i−1), performing Viterbi decoding once with state $\beta(s)$ as fixed initial state and termination state, where $\beta(s)$ is the starting state of the maximum likelihood path (MLP) found in the ith iteration, i.e. $P_{MLP}^i(\beta(s),s)$; obtaining a tail-biting path $P_{TBP}(\beta(s),\beta(s))$ with metric $M_{TBP}(\beta(s),\beta(s))$ thereof; if $M_{TBP}(\beta(s),\beta(s)) > M_{MLTBP}^O$, updating $(P_{MLTBP}^O, M_{MLTBP}^O)$ with $(P_{TBP}(\beta(s),\beta(s)), M_{TBP}(\beta(s),\beta(s)))$, and letting $M_{state}(\beta(s))=0$ and $M_{path,0}^{i+1}(\beta(s))=0$.

Step 105:

i++ and letting sum(i)=0, and performing a next iteration, that is, repeating S102 to S104.

The optimality of the channel decoding method is described as follows:

(1) If the MLP and MLTBP found in the first iteration are the same, and sum(1)=0 in Step 3, and the MLTBP can be output in Step 5.

(2) Through detection over the relationship between the state metric $M_{state}(s)$ and $M_{MLTBP}^{O}$, impossible initial states are ruled out from $S_0$. Through multiple iterations, all impossible states are ruled out. Only the initial state of a tail-biting path having maximum likelihood with a received sequence survives. The algorithm is finally convergent to the optimal tail-biting path to be output.

(3) When a circular trap occurs, the equation sum(i)=sum(i−1) is true. At this time, the initial state β(s) of the MLP obtained in the previous iteration is used for regular Viterbi decoding, and the obtained surviving tail-biting path is used to update $M_{MLTBP}^{O}$ or rule out β(s) from the set of initial states candidates. Such a processing manner effectively solves the problem that the algorithm is not convergent due to the circular trap.

In conclusion, the decoding algorithm provided in the embodiment of the present invention is finally convergent to the optimal tail-biting path. The decoding method according to the present invention may be applied to channel decoding in current and next generation mobile communications systems. The method provides a practical optimal decoding algorithm for a tail-biting convolutional codes and reduces the complexity of the decoding scheme.

Embodiment 2

In this embodiment, the channel decoding method (namely the method for decoding a tail-biting convolutional code) according to Embodiment 1 is recorded as reduced-complexity maximum likelihood decoder (RC-MLD) method, and is compared with the WAVA. A simple termination condition is used in the WAVA. This embodiment compares a BLER and Average Number of Iteration (ITER) of the RC-MLD with those of the WAVA.

The simulation is based on an Additive White Gaussion Noise (AWGN) channel, and encoded bits are modulated through quadri phase shift keying (QPSK). For the WAVA, the maximum number of iterations allowed in the simulation is set to 20, and for the RC-MLD method, the maximum number of iterations is set to different values in different application scenarios because theoretically, the required maximum number of iterations may be $2^v$.

First group of simulation tests: Comparison of decoding performance of different decoding algorithms on a tail-biting convolutional code.

Firstly, the application of the tail-biting convolutional codes in EDGE is analyzed. Tail-biting convolutional encoding with a code rate of ⅓ is used for a data header in Type 5 of the EDGE. The octal generator polynomials of this convolutional code are {133, 171, 145} with constraint length of 7. Therefore, the maximum number of iterations in the RC-MLD is set to 64. The length of a data header input to an encoder is 36 bits, and the puncture is not considered herein. The tail-biting convolutional encoding can reduce at least 15% of the loss of effective code rate. A simulation result is shown in Table 1.

TABLE 1

Decoding performance of different decoding algorithms in an EDGE scenario

| | Eb/N0 | | | | | | | |
|---|---|---|---|---|---|---|---|---|
| | −2 dB | | 0 dB | | 2 dB | | 4 dB | |
| | BLER | ITER | BLER | ITER | BLER | ITER | BLER | ITER |
| RC-MLD | 0.7894 | 3.97 | 0.2701 | 2.27 | 0.0126 | 1.26 | 6.2e−5 | 1.05 |
| WAVA | 0.7923 | 18.83 | 0.2737 | 13.81 | 0.0129 | 5.50 | 6.2e−5 | 1.95 |

Secondly, the application of the tail-biting convolutional code in LTE is analyzed. The octal generator polynomials in LTE broadcast channel are {133, 171, 165} with code rate of ⅓ and constraint length of 7. Therefore, the maximum number of iterations of the RC-MLD is set to 64; the length of the information sequence input to an encoder is 40 bits. Without the tail-biting encoding, an actual transmission loss of effective code rate reaches 13%.

TABLE 2

Decoding performance of different decoding algorithms in an LTE scenario

| | Eb/N0 | | | | | | | |
|---|---|---|---|---|---|---|---|---|
| | −2 dB | | 0 dB | | 2 dB | | 4 dB | |
| | BLER | ITER | BLER | ITER | BLER | ITER | BLER | ITER |
| RC-MLD | 0.8178 | 3.62 | 0.2922 | 2.16 | 0.0138 | 1.26 | 6.52e−5 | 1.05 |
| WAVA | 0.8203 | 18.94 | 0.2946 | 13.98 | 0.0138 | 5.58 | 6.52e−5 | 1.96 |

Second group of simulation tests: Comparison of decoding performance of different decoding algorithms on a special block code.

The (24, 12) Golay code is an example of block codes that can be represented by a tail-biting trellis diagram. The (24, 12) Golay code can be generated by a convolutional encoder with code rate of ½, constraint length of 7 and octal generator polynomials of {103, 166}. The maximum number of iterations allowed in the RC-MLD is set to 64 herein.

TABLE 3

Decoding performance of different decoding algorithms on a (24, 12) Golay code

| | Eb/N0 | | | | | | | |
|---|---|---|---|---|---|---|---|---|
| | −1 dB | | 1 dB | | 3 dB | | 5 dB | |
| | BLER | ITER | BLER | ITER | BLER | ITER | BLER | ITER |
| RC-MLD | 0.4196 | 4.56 | 0.1346 | 2.75 | 0.0128 | 1.50 | 0.0002 | 1.10 |
| WAVA | 0.4299 | 17.83 | 0.1392 | 14.05 | 0.0133 | 7.72 | 0.0002 | 2.87 |

According to the above simulation results, since the RC-MLD is an optimal decoding algorithm, the BLER thereof is better than that of the sub-optimal algorithm WAVA. Meanwhile, effective processing is performed on the circular trap, and impossible initial states are ruled out during the decoding process. Therefore, the RC-MLD has a greater convergence speed than the WAVA.

Embodiment 3

For a tail-biting convolutional code, the initial state of encoder is initialized using last few information bits, and when the encoding is ended, the end state of the encoder is the same as the initial state thereof, which is referred to as "tail-biting". FIG. 1 illustrates a trellis diagram of a tail-biting convolutional code with a code rate of ½ and generator polynomials of {7, 5}. As shown in FIG. 1, the left part is tail-biting trellis diagram corresponding to 8-bit information sequence. The right part is butterfly diagrams corresponding to this code, in which the numeral beside each solid circle is a state value, and the numeral on each line is an encoding output value. Each position k in the tail-biting trellis diagram has $2^v$ states, in which $0 \leq k \leq L-1$, v is the number of encoding registers, and L is the length of the information sequence. $S_k$ is used to indicate a state space of position k.

An MLP (code word/path) $P_{MLP}^i$ is obtained each time the tail-biting convolutional decoding method is repeated. Sometimes $P_{MLP}^i$ is not an optimal tail-biting path, therefore the method needs to proceed to a next iteration. The circulation continues until a preset termination condition is satisfied.

In the ith iteration, $M_k^i(s)$ indicates the accumulated metric of surviving path that enters state s at position k.

Herein, $\beta(s)$ is used to indicate the initial state of the surviving path terminated at state s, it is stipulated that $s \in S_L$.

In the ith iteration, the net path metric of surviving path $P^i(\beta(s^\dagger), s^\dagger)$ is recorded as $M_{path}^i(\beta(s^\dagger), (s^\dagger)$, which indicates the sum of metrics of all branches of the path in the current iteration, that is, $M_{path}^i(\beta(s^\dagger), s^\dagger) = M_{path,L}^i(s^\dagger) - M_{path,0}^i(\beta(s^\dagger))$. Hence, net increases of MLP $P_{MLP}^i(\beta(s), s)$ and MLTBP $P_{MLTBP}^i(s', s')$ are respectively expressed as follows: $M_{MLP}^i(\beta(s), s) = M_{path,L}^i(s) - M_{path,0}^i(\beta(s))$, and $M_{MLTBP}^i(s', s') = M_{path,L}^i(s') - M_{path,0}^i(s')$. It should be noted that a tail-biting path may not be found in each time of iteration.

In this embodiment, $(P_{MLP}^O, M_{MLP}^O)$ is used to recode the MLP found till the current iteration and a metric thereof, and $(P_{MLTBP}^O, M_{MLTBP}^O)$ is used to recode the optimal MLTBP found till the current iteration and a metric thereof. Finally, the maximum number of iterations allowed is set to N.

When decoding based on a CVA is performed, a circular phenomenon may occur, that is, surviving paths obtained in two iterations are the same. When the circular trap occurs, further iterations do not produce any better decoding output.

Therefore, one of the following conditions is used to detect whether a circular trap occurs:

$$M_{MLTBP}^i = M_{MLTBP}^O \qquad 1)$$

$$M_{MLP}^i = M_{MLP}^{i-1} \qquad 2)$$

The above conditions may effectively detect the occurrence of a circular trap and timely terminate the iteration.

When no circular trap occurs, condition 3) is used to terminate the iteration:

$$M_{MLP}^i = M_{MLTBP}^i \qquad 3)$$

On the basis of the above conditions, this embodiment provides a more efficient channel decoding method (ET-CVA, short for Early-terminated CVA). The method comprises the following steps:

S201: setting the maximum allowed number of iterations N=20. when i=1 (during the first iteration), initializing an accumulated metric of each initial state to 0, that is, $M_{path,0}^i(s)=0$, where $s \in S_0$, and performing an MVA.

S202: if $P_{MLP}^1 = P_{MLTBP}^1$, stopping decoding, and outputting $P_{MLTBP}^1$ as the decoding result; otherwise, saving $P_{MLP}^1$ in $P_{MLP}^O$; if $M_{MLTBP}^1 > 0$, letting $P_{MLTBP}^O = P_{MLTBP}^1$ and $M_{MLTBP}^O = M_{MLTBP}^1$;

S203: when i>1 (in an iteration after the first iteration), letting $M_{path,0}^i(s) = M_{path,L}^{i-1}(s)$, and performing an MVA; finding $(P_{MLP}^i, M_{MLP}^i)$; finding $(P_{MLTBP}^i, M_{MLTBP}^i)$, and if $M_{MLTBP}^i > M_{MLTBP}^O$, letting $P_{MLTBP}^O = P_{MLTBP}^i$;

S204: If either $M_{MLP}^i = M_{MLTBP}^i$ or $M_{MLTBP}^i = M_{MLTBP}^O$ is satisfied, stopping decoding, and performing S206; otherwise, continuing to perform S205 (ET-CVA 1).

if either $M_{MLP}^i = M_{MLTBP}^i$ or $M_{MLP}^i = M_{MLP}^{i-1}$ is satisfied, stopping decoding, and performing S206; otherwise, continuing to perform S205 (ET-CVA 2).

S205: if $M_{MLTBP}^i > M_{MLTBP}^O$, letting $M_{MLTBP}^O = M_{MLTBP}^i$; if N is not reached, i.e. i<N, returning to S203; otherwise, performing S206.

S206: if $P_{MLTBP}^O$ exists, outputting $P_{MLTBP}^O$ as the decoding result; otherwise, outputting $P_{MLP}^O$.

Figure 2:
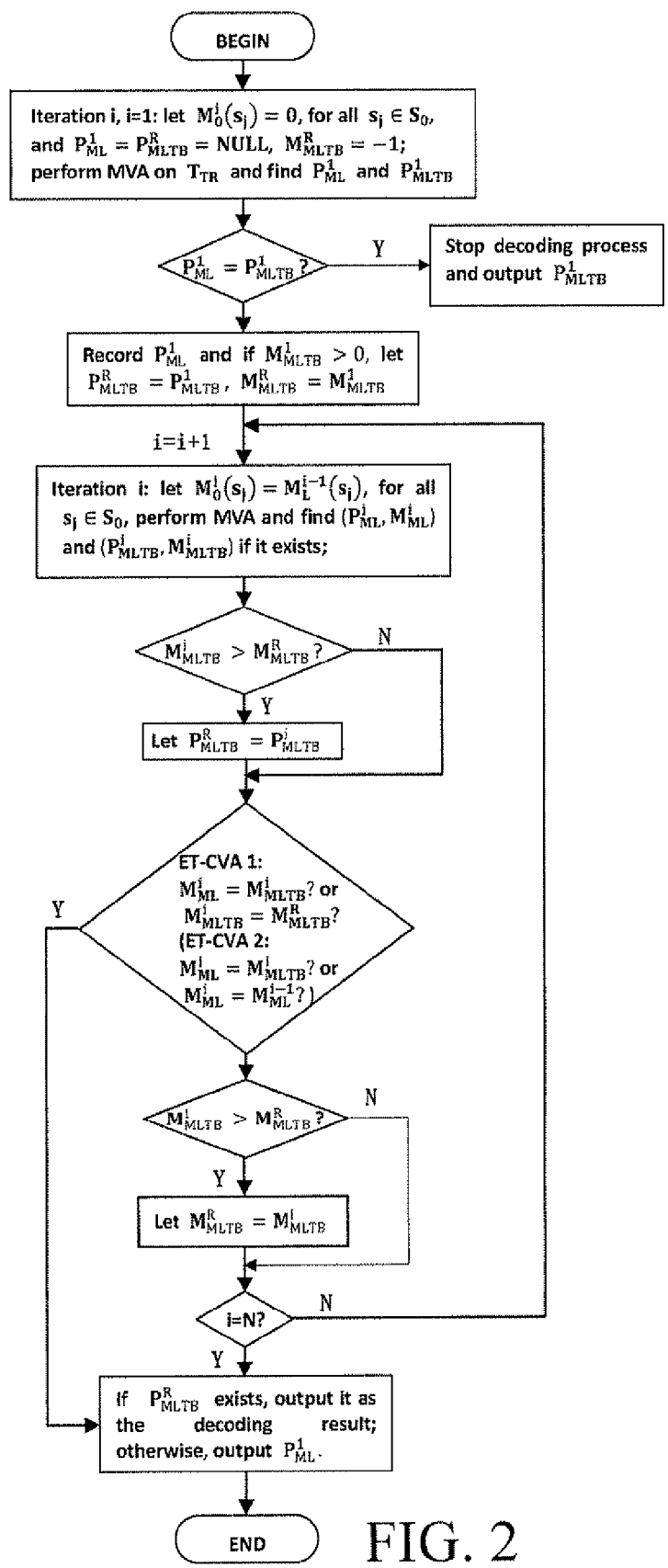
FIG. 2 is a flow chart of a channel decoding method according to Embodiment 2 of the present invention.

For better description of the above method, the corresponding flow chart is shown in FIG. 2.

Embodiment 4

Figure 3:
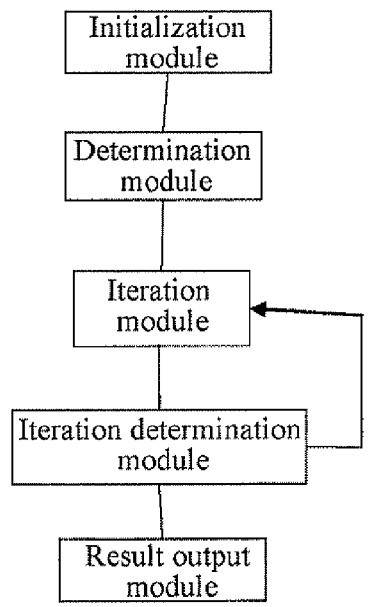
FIG. 3 is a schematic assembly view of a decoder for decoding a tail-biting convolutional code according to the embodiment of the present invention.
Figure 4:
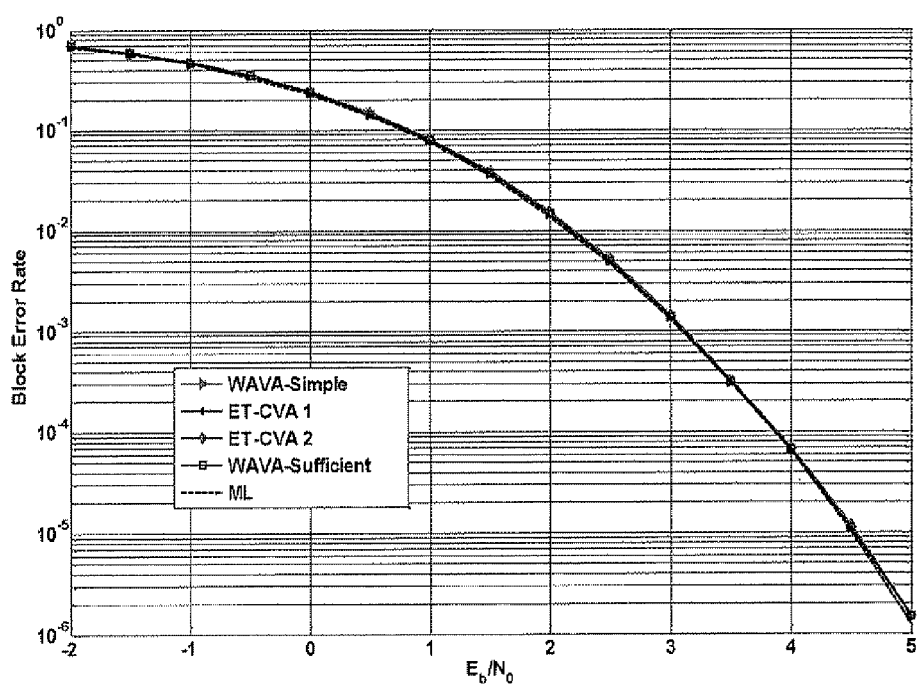
FIG. 4 is a comparison graph between a Block Error Rate (BLER) of an embodiment of the present invention and that of the WAVA when the information bit length L is equal to 24.
Figure 5:
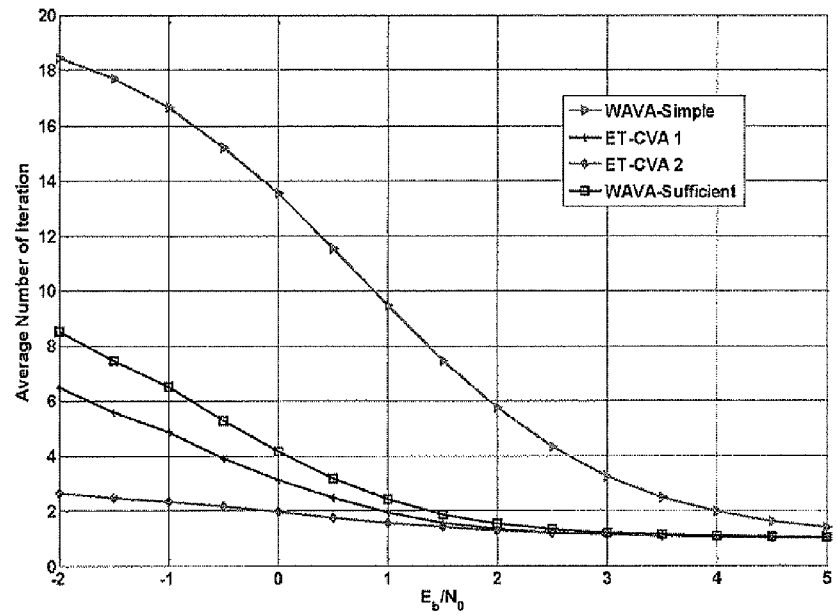
FIG. 5 is a comparison graph between Average Number of Iterations of an embodiment of the present invention and that of the WAVA when the information bit length L is equal to 24.
Figure 6:
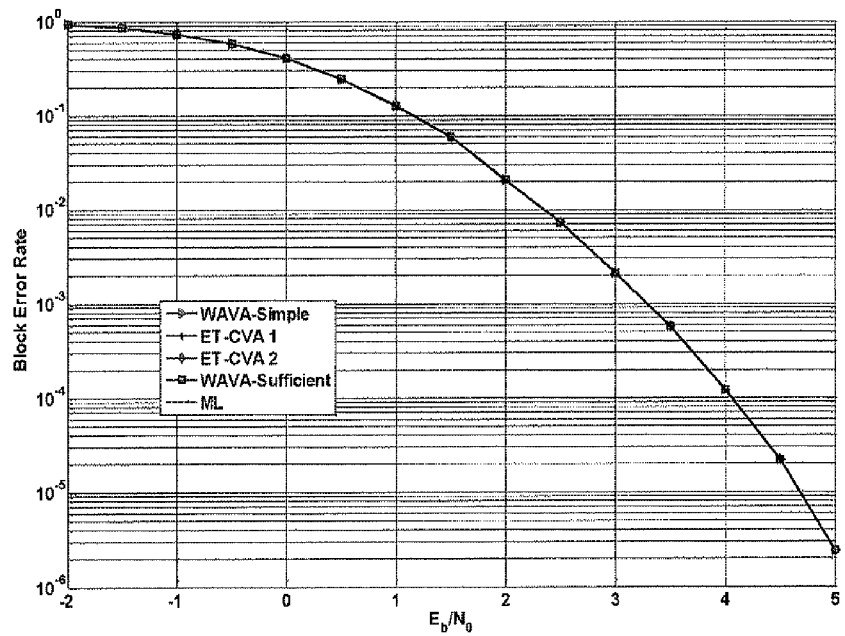
FIG. 6 is a comparison graph between a BLER of an embodiment of the present invention and that of the WAVA when the information bit length L is equal to 64.
Figure 7:
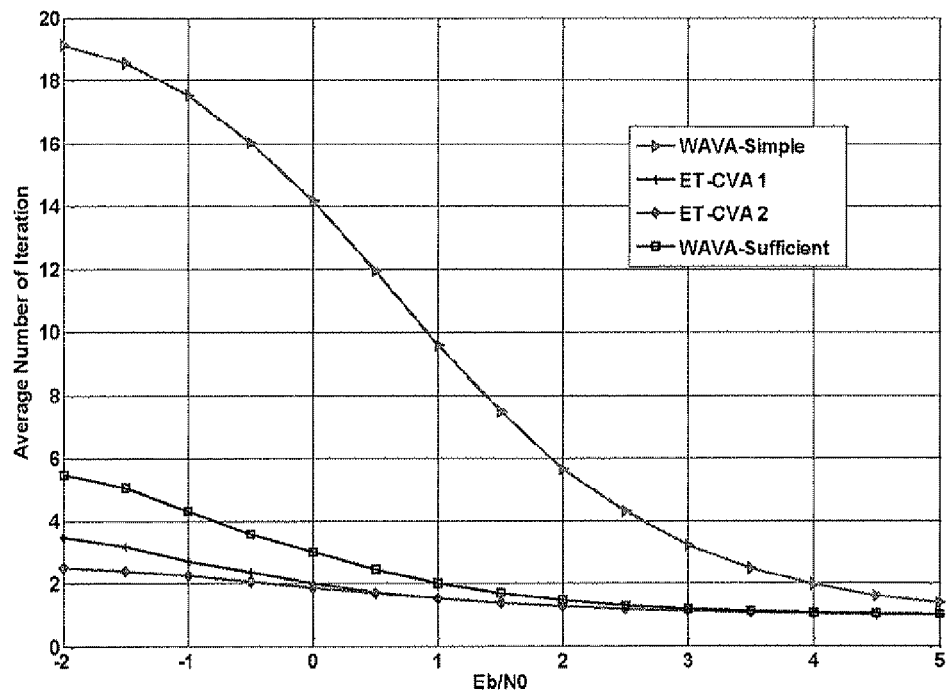
FIG. 7 is a comparison graph between Average Number of Iterations of an embodiment of the present invention and that of the WAVA when the information bit length L is equal to 64.

This embodiment provides a decoder for implementing the channel decoding method in Embodiment 3. As shown in FIG. 3, the decoder comprises the following modules:

an initialization module, used for initializing an accumulated metric of each initial state to 0, that is, $M_{path,0}^i(s)=0$, where $s \in S_0$, and performing an MVA during a first iteration (when i=1); setting the maximum allowed number of iterations N=20.

a determination module, used for determining whether an MLP is equal to an optimal tail-biting path, that is, whether $P_{MLP}^1 = P_{MLTBP}^1$; if yes, stopping decoding and outputting $P_{MLTBP}^1$ as a decoding result; otherwise, saving $P_{MLP}^1$, and making an optimal MLP equal to the MLP, that is, $P_{MLP}^O = P_{MLP}^1$; if $M_{MLTBP}^1 > 0$, letting $P_{MLTBP}^O = P_{MLTBP}^1$ and $M_{MLTBP}^O = M_{MLTBP}^1$;

an iteration module, used for performing an iteration operation, specifically, when i>1 (in an iteration after the first iteration), initializing the accumulated path metric of the surviving path that enters state s in ith iteration to be the accumulated path metric $M_{path,L}^{i-1}(s)$ of the path terminated at state s at the end of the previous iteration, that is, letting $M_{path,0}^i(s) = M_{path,L}^{i-1}(s)$, and performing an MVA; finding $(P_{MLP}^i, M_{MLP}^i)$; finding $(P_{MLTBP}^i, M_{MLTBP}^i)$, and if $M_{MLTBP}^i > M_{MLTBP}^O$, letting $P_{MLTBP}^O = P_{MLTBP}^i$;

an iteration determination module, used for stopping decoding according to a preset condition (if either $M_{MLP}^i = M_{MLTBP}^i$ or $M_{MLTBP}^i = M_{MLTBP}^O$ is satisfied), and enabling result output of a result output module when $P_{MLTBP}^O$ exists; if $M_{MLTBP}^i > M_{MLTBP}^O$, letting $M_{MLTBP}^O = M_{MLTBP}^i$; and if the maximum allowed number of iterations is not reached, continuing the operation of the iteration module; and the result output module, used for outputting a decoding result, that is, when $P_{MLTBP}^O$ exists, outputting $P_{MLTBP}^O$ as a decoding result; otherwise, outputting $P_{MLP}^O$.

Embodiment 5

This embodiment provides a decoder for implementing the channel decoding method in Embodiment 4. The decoder comprises the following modules:

an initialization module, used for initializing an accumulated path metric of each initial state to 0, that is, $M_{path,0}^i(s) = 0$, where $s \in S_0$, and performing an MVA during the first iteration (when i=1); setting the maximum allowed number of iterations N=20;

a determination module, used for determining whether an MLP is equal to an optimal tail-biting path, that is, whether $P_{MLP}^1 = P_{MLTBP}^1$; if yes, stopping decoding and outputting $P_{MLTBP}^1$ as a decoding result; otherwise, saving $P_{MLP}^1$, and making an optimal MLP equal to the MLP, that is, $P_{MLP}^O = P_{MLP}^1$; if $M_{MLTBP}^1 > 0$, letting $P_{MLTBP}^O = P_{MLTBP}^1$ and $M_{MLTBP}^O = M_{MLTBP}^1$;

an iteration module, used for performing an iteration operation, specifically, when i>1 (in an iteration after the first iteration), initializing the accumulated path metric of the surviving path that enters state s in ith iteration to be the accumulated path metric $M_{path,L}^{i-1}(s)$ of the path terminated at state s at the end of the previous iteration, that is, letting $M_{path,0}^i(s) = M_{path,L}^{i-1}(s)$, and performing an MVA; finding $(P_{MLP}^i, M_{MLP}^i)$; finding $(P_{MLTBP}^i, M_{MLTBP}^i)$, and if $M_{MLTBP}^i > M_{MLTBP}^O$, letting $P_{MLTBP}^O = P_{MLTBP}^i$;

an iteration determination module, used for stopping decoding according to a preset condition (if either $M_{MLP}^i = M_{MLTBP}^i$ or $M_{MLP}^i = M_{MLP}^{i-1}$ is satisfied), and enabling result output of a result output module when $P_{MLTBP}^O$ exists; if $M_{MLTBP}^i > M_{MLTBP}^O$, letting $M_{MLTBP}^O = M_{MLTBP}^i$; and if the maximum allowed number of iterations is not reached, continuing the operation of the iteration module; and the result output module, used for outputting a decoding result, that is, when $P_{MLTBP}^O$ exists, outputting $P_{MLTBP}^O$ as a decoding result; otherwise, outputting $P_{MLP}^O$.

Compared with the prior art, the decoder according to the present invention significantly reduces the complexity of decoding, reduces the number of iterations, and saves the storage space during the decoding process. The new channel decoding method and decoder are effective not only on the tail-biting convolutional code, but also on common block codes that can be presented by a tail-biting trellis diagram.

Performance of the channel decoding methods according to Embodiment 3 is illustrated below through two specific simulation examples. The simulations herein are based on an AWGN channel, QPSK-modulated symbols are input to the channel.

The first simulation example is directed to a tail-biting convolutional code. In the simulation, an LTE convolutional code is used; the octal generator polynomials are {133, 171, 165}, and the maximum number of iterations is set to 20. In order to verify the effectiveness of the method on both a medium-length tail-biting convolutional code and a long tail-biting convolutional code, in the simulation, the information bit length L is set to 24 and 64 respectively (L=24 and L=64). Comparison curves indicating BLER and Average Number of Iterations (ANI) of this method and those of the WAVA are provided below.

According to the simulation results shown in FIG. 4 to FIG. 7, in different code lengths, both the ET-CVAs (1 and 2) are capable of providing performance most close to optimality. Moreover, the new decoding method significantly reduces the decoding complexity and the number of iterations.

The second simulation example is directed to block codes that can be presented by a tail-biting trellis diagram. The Golay code is taken as an example below. ET-CVAs (1 and 2) and the WAVA are used for decoding the (24, 12) Golay codes. The obtained BLER and Average Number of Iterations are shown in FIG. 8 and FIG. 9.

Figure 8:
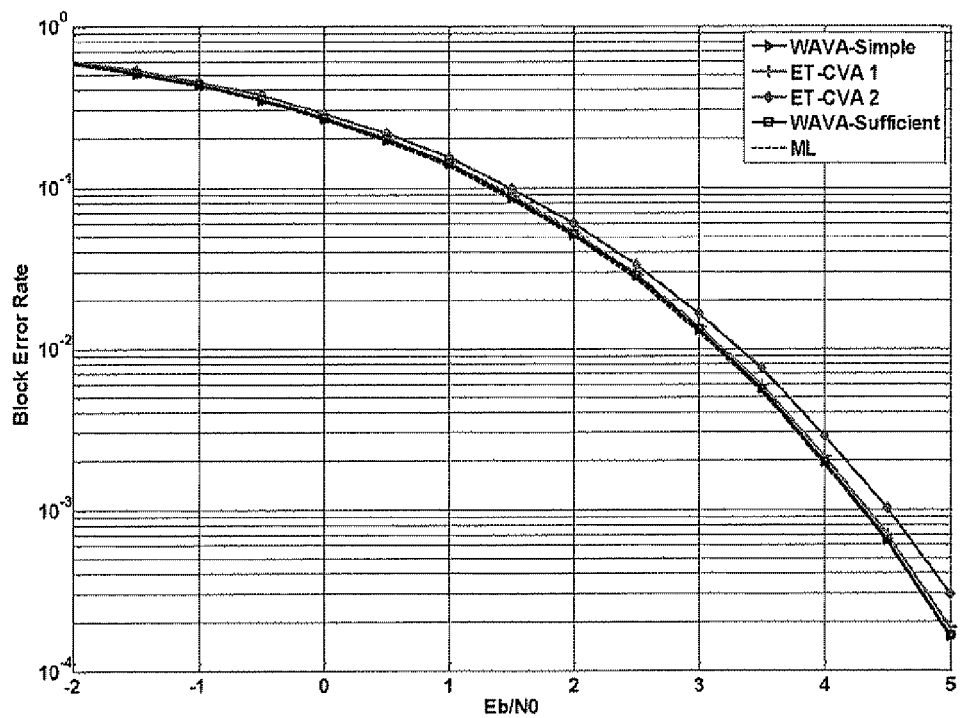
FIG. 8 is a comparison graph between a BLER of an embodiment of the present invention used for decoding the block Golay code presented in the tail-biting trellis diagram and that of the WAVA used for decoding the block Golay code presented in the tail-biting trellis diagram.
Figure 9:
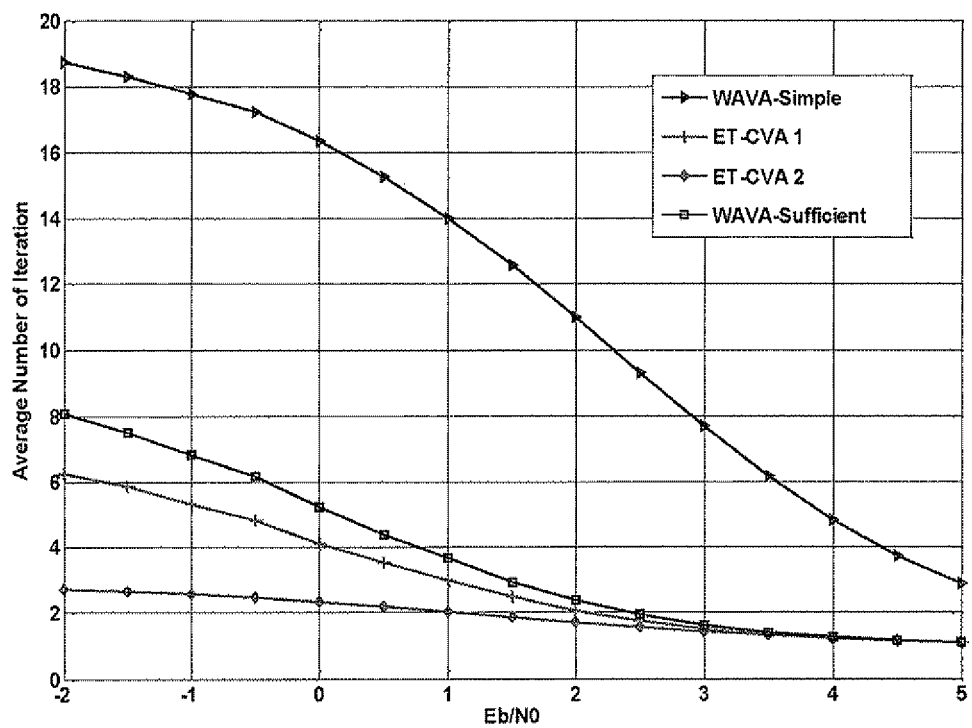
FIG. 9 is a comparison graph between Average Number of Iterations of an embodiment of the present invention used for decoding the block Golay code presented in the tail-biting trellis diagram and that of a WAVA used for decoding the block Golay code presented in the tail-biting trellis diagram.

According to the simulation results in FIG. 8 and FIG. 9, the new method for decoding a tail-biting convolutional code not only reduces decoding complexity and the number of iterations, but also saves the storage space during the decoding process. The new method is effective not only on the tail-biting convolutional code, but also on common block codes that can be represented by a tail-biting trellis diagram.

The channel coding method and decoder according to the present invention are effective not only on the tail-biting convolutional code, but also on common block codes that can be represented by a tail-biting trellis diagram.

Herein, the description and application of the present invention are illustrative, and the scope of the present invention is not intended to be limited to the above embodiments. Variations and changes to the embodiments disclosed herein are possible. Replacement made to the embodiments and equivalent parts are well-known to persons skilled in the art. It should be known to persons skilled in the art that, the present invention can be implemented in other forms, structures, arrangements, ratios and through other components, materials, and parts without departing from the spirit or essential features of the present invention.

What is claimed is:

1. A channel decoding method, comprising:
S101: during the first iteration, i.e. i=1, initializing, via a mobile or a wireless communications system, the metric $M_{path,0}^i(s)$ of the surviving path that enters state s at position 0 to 0, where $s \in S_0$, $S_0$ indicates the state space at position 0, and i indicates the number of iterations; setting the metric of the optimal maximum likelihood tail-biting path (MLTBP) $P_{MLTBP}^O$ to 0, that is, letting $P_{MLTBP}^O = 0$; performing a Modified Viterbi Algorithm (MVA), and searching for MLTBP in current iteration; for all $s \in S_0$, setting the state metric of state s to be equal to $M_{path,L}^1(s)$, that is, letting $M_{state}(s) = M_{path,L}^1(s)$;

S102: if the net path metric $M_{MLTBP}{}^i$ of $P_{MLTBP}{}^i(s',s)$ found in current iteration is greater than the metric $M_{MLTBP}{}^O$, that is, $M_{MLTBP}{}^i>M_{MLTBP}{}^O$, updating ($P_{MLTBP}$, $M_{MLTBP}{}^O$) with ($P_{MLTBP}{}^i(s',s)$, $M_{MLTBP}$);

S103: for $s \in S_L$, where L is the length of information sequence, and $S_L$ indicates the state space at position L, comparing the state metric $M_{state}(s)$ of state s with the metric $M_{MLTBP}{}^O$ of the MLTBP in the latest update; if $M_{state}(s) \leq M_{MLTBP}{}^O$, updating $M_{state}(s)=0$; otherwise, letting $M_{path,0}{}^{i+1}(s)=M_{path,L}{}^i(s)$; if $M_{state}(s) > M_{path,L}{}^i(s) - M_{path,0}{}^i(s)$, updating $M_{state}(s) = M_{path,L}{}^i(s) - M_{path,0}{}^i(s)$; making statistics on the number of states with state metric greater than $M_{MLTBP}{}^O$, and saving the number of states in sum(i);

S104: if sum(i)=0, stopping the iteration, and outputting the optimal MLTBP $P_{MLTBP}{}^O$; if sum(i)=sum(i−1), performing Viterbi decoding once with state β(s) as fixed initial state and termination state, where β(s) is the starting state of the maximum likelihood path (MLP) found in the ith iteration, i.e. $P_{MLP}{}^i(\beta(s),s)$; obtaining a tail-biting path $P_{TBP}(\beta(s),\beta(s))$ with metric $M_{TBP}(\beta(s),\beta(s))$ thereof; if $M_{TBP}(\beta(s),\beta(s)) > M_{MLTBP}{}^O$, updating ($P_{MLTBP}{}^O$, $M_{MLTBP}{}^O$,) with ($P_{TBP}(\beta(s),\beta(s))$, $M_{TBP}(\beta(s),\beta(s))$)), and letting $M_{state}(\beta(s))=0$ and $M_{path,0}{}^{i+1}(\beta(s))=0$;

S105: i++ and letting sum(i)=0, and performing a next iteration, that is, repeating S102 to S104.

2. A channel decoding method, comprising:

S201: setting, via a mobile or wireless communications system, the maximum allowed number of iterations N=20, when i=1 (during the first iteration), initializing an accumulated metric of each initial state to 0, that is, $M_{path,0}{}^i(s)=0$, where $s \in S_0$, and performing a Modified Viterbi Algorithm (MVA);

S202: if the maximum likelihood path (MLP) is equal to the optimal tail-biting path, that is, $P_{MLP}{}^1=P_{MLTBP}{}^1$, stopping decoding, and outputting $P_{MLTBP}{}^1$ as the decoding result; otherwise, saving $P_{MLP}{}^1$ in $P_{MLP}{}^O$; if $M_{MLTBP}{}^1 > 0$, letting $P_{MLTBP}{}^O=P_{MLTBP}{}^1$ and $M_{MLTBP}{}^O=M_{MLTBP}{}^1$;

S203: when i>1 (in an iteration after the first iteration), letting $M_{path,0}{}^i(s)=M_{path,L}{}^{i-1}(s)$, and performing an MVA; finding ($P_{MLP}{}^i$, $M_{MLP}{}^i$); finding ($P_{MLTBP}{}^i$, $M_{MLTBP}{}^i$), and if $M_{MLTBP}{}^i > M_{MLTBP}{}^O$, letting $P_{MLTBP}{}^O=P_{MLTBP}{}^i$;

S204: if either $M_{MLP}{}^i=M_{MLTBP}{}^i$ or $M_{MLTBP}{}^i=M_{MLTBP}{}^O$ is satisfied, stopping decoding, and performing S206; otherwise, continuing to perform S205;

S205: if $M_{MLTBP}{}^i > M_{MLTBP}{}^O$, letting $M_{MLTBP}{}^O=M_{MLTBP}{}^i$; if N is not reached, i.e. i<N, returning to S203; otherwise, performing S206;

S206: if $P_{MLTBP}{}^O$ exists, outputting $P_{MLTBP}{}^O$ as the decoding result; otherwise, outputting $P_{MLP}{}^O$.

3. A channel decoding method, comprising:

S301: setting, via a mobile or a wireless communications system, the maximum allowed number of iterations N=20, when i=1 (during the first iteration), initializing an accumulated metric entering each initial state to 0, that is, $M_{path,0}{}^i(s)=0$, where $s \in S_0$, and performing a Modified Viterbi Algorithm (MVA);

S302: if the maximum likelihood path (MLP) is equal to the optimal tail-biting path, that is, $P_{MLP}{}^1=P_{MLTBP}{}^1$, stopping decoding, and outputting $P_{MLTBP}{}^1$ as the decoding result; otherwise, saving $P_{MLP}{}^1$ in $P_{MLP}{}^O$; if $M_{MLTBP}{}^1 > 0$, letting $P_{MLTBP}{}^O=P_{MLTBP}{}^1$ and $M_{MLTBP}{}^O=M_{MLTBP}{}^1$;

S303: when i>1 (in an iteration after the first iteration), letting $M_{path,0}{}^i(s)=M_{path,L}{}^{i-1}(s)$, and performing an MVA; finding ($P_{MLP}{}^i$, $M_{MLP}{}^i$); finding ($P_{MLTBP}{}^i$, $M_{MLTBP}{}^i$), and if $M_{MLTBP}{}^i > M_{MLTBP}{}^O$, letting $P_{MLTBP}{}^O=P_{MLTBP}{}^i$;

S304: if either $M_{MLP}{}^i=M_{MLTBP}{}^i$ or $M_{MLP}{}^i=M_{MLP}{}^{i-1}$ is satisfied, stopping decoding, and performing S306; otherwise, continuing to perform S305;

S305: if $M_{MLTBP}{}^i > M_{MLTBP}{}^O$, letting $M_{MLTBP}{}^O=M_{MLTBP}{}^i$; if N is not reached, i.e. i<N, returning to S303; otherwise, performing S306;

S306: if $P_{MLTBP}{}^O$ exists, outputting $P_{MLTBP}{}^O$ as the decoding result; otherwise, outputting $P_{MLP}{}^O$.

4. A non-transitory computer-readable medium comprising computer-readable code that, when executed, performs a method, the method comprising:

initializing an accumulated path metric of each initial state to 0, that is, $M_{path,0}{}^i(s)=0$ where $s \in S_0$, and performing a Modified Viterbi Algorithm (MVA) during the first iteration (when i=1); setting the maximum allowed number of iterations N=20;

determining whether a maximum likelihood path ("MLP") is equal to an optimal tail-biting path, that is, whether $P_{MLP}{}^1=P_{MLTBP}{}^1$; if yes, stopping decoding and outputting $P_{MLTBP}{}^1$ as a decoding result; otherwise, saving $P_{MLP}{}^1$, and making an optimal MLP equal to the MLP, that is, $P_{MLP}{}^O=P_{MLP}{}^1$; if $M_{MLTBP}{}^1 > 0$, letting $P_{MLTBP}{}^O=P_{MLTBP}{}^1$ and $M_{MLTBP}{}^O=M_{MLTBP}{}^1$;

performing an iteration operation, specifically, when i>1 (in an iteration after the first iteration), initializing the accumulated path metric of the surviving path that enters state s in ith iteration to be the accumulated path metric $M_{path,0}{}^i(s)=M_{path,L}{}^{i-1}(s)$, of the path terminated at state s at the end of the previous iteration, that is, letting $M_{path,0}{}^i(s)=M_{path,L}{}^{i-1}(s)$, and performing an MVA; finding ($P_{MLP}{}^i$, $M_{MLP}{}^i$); finding ($P_{MLTBP}{}^i$, $M_{MLTBP}{}^i$), and if $M_{MLTBP}{}^i > M_{MLTBP}{}^O$, letting $P_{MLTBP}{}^O=P_{MLTBP}{}^i$;

stopping decoding according to a preset condition (if either $M_{MLP}{}^i=M_{MLTBP}{}^i$ or $M_{MLTBP}{}^i=M_{MLTBP}{}^O$ is satisfied), and enabling result output of a result output module when $P_{MLTBP}{}^O$ exists; if $M_{MLTBP}{}^i > M_{MLTBP}{}^O$, letting $M_{MLTBP}{}^O=M_{MLTBP}{}^i$; and if the maximum allowed number of iterations is not reached, continuing the operation of the iteration module; and outputting a decoding result, that is, when $P_{MLTBP}{}^O$ exists, outputting $P_{MLTBP}{}^O$ as a decoding result; otherwise, outputting $P_{MLP}{}^O$.

5. A channel decoder comprising a non-transitory computer-readable medium comprising computer-readable code that, when executed, performs a method, the method comprising:

initialize an accumulated path metric of each initial state to 0, that is, $M_{path,0}{}^i(s)=0$ where $s \in S_0$, and performing a Modified Viterbi Algorithm (MVA) during the first iteration (when i=1); setting the maximum allowed number of iterations N=20;

determine whether a maximum likelihood path ("MLP") is equal to an optimal tail-biting path, that is, whether $P_{MLP}{}^1=P_{MLTBP}{}^1$; if yes, stopping decoding and outputting $P_{MLTBP}{}^1$ as a decoding result; otherwise, saving $P_{MLP}{}^1$, and making an optimal MLP equal to the MLP, that is, $P_{MLP}{}^O=P_{MLP}{}^1$; if $M_{MLTBP}{}^1 > 0$, letting $P_{MLTBP}{}^O=P_{MLTBP}{}^1$ and $M_{MLTBP}{}^O=M_{MLTBP}{}^1$;

perform an iteration operation, specifically, when i>1 (in an iteration after the first iteration), initializing the accumulated path metric of the surviving path that enters state s in ith iteration to be the accumulated path metric $M_{path,L}^{i-1}(s)$ of the path terminated at state s at the end of the previous iteration, that is, letting $M_{path,0}^{i}(s) = M_{path,L}^{i}(s)$, and performing an MVA; finding $(P_{MLP}^{i}, M_{MLP}^{i})$; finding $(P_{MLTBP}^{i}, M_{MLTBP}^{i})$, and if $M_{MLTBP}^{i} > M_{MLTBP}^{O}$, letting $P_{MLTBP}^{O} = P_{MLTBP}^{i}$;

stop decoding according to a preset condition (if either $M_{MLP}^{i} = M_{MLTBP}^{i}$ or $M_{MLP}^{i} = M_{MLP}^{i-1}$ is satisfied), and enabling result output of a result output module when $P_{MLTBP}^{O}$ exists; if $M_{MLTBP}^{i} > M_{MLTBP}^{O}$, letting $M_{MLTBP}^{O} = M_{MLTBP}^{i}$; and if the maximum allowed number of iterations is not reached, continuing the operation of the iteration module; and output a decoding result, that is, when $P_{MLTBP}^{O}$ exists, outputting $P_{MLTBP}^{O}$ as a decoding result; otherwise, outputting $P_{MLP}^{O}$.

\* \* \* \* \*